United States Patent [19]
Jean

[11] Patent Number: 5,701,951
[45] Date of Patent: Dec. 30, 1997

[54] HEAT DISSIPATION DEVICE FOR AN INTEGRATED CIRCUIT

[76] Inventor: Amigo Jean, No. 18, Alley 5, Lane 19, Nu-Chung Rd., I-Lan City, Taiwan

[21] Appl. No.: 360,988

[22] Filed: Dec. 20, 1994

[51] Int. Cl.$^6$ .............................. H05K 7/20; H01L 23/36
[52] U.S. Cl. .................... 165/121; 165/80.3; 165/185; 361/697; 174/16.3
[58] Field of Search .................... 165/80.3, 185, 165/121; 174/16.3; 361/697, 710; 257/713, 722

[56] References Cited

U.S. PATENT DOCUMENTS

| | | | |
|---|---|---|---|
| 3,143,592 | 8/1964 | August | 174/15 |
| 3,256,703 | 6/1966 | Selwitz | 62/3 |
| 3,409,075 | 11/1968 | Long | 165/154 |
| 3,653,433 | 4/1972 | Scharli | 165/80 |
| 4,279,294 | 7/1981 | Fitzpatrick et al. | 165/45 |
| 4,546,405 | 10/1985 | Hultmark et al. | 361/386 |
| 4,588,023 | 5/1986 | Munekawa | 165/104 |
| 4,987,478 | 1/1991 | Braun et al. | 357/81 |
| 5,095,404 | 3/1992 | Chao | 361/385 |
| 5,113,315 | 5/1992 | Capp et al. | 361/386 |
| 5,253,702 | 10/1993 | Davidson et al. | 165/80.4 |
| 5,287,249 | 2/1994 | Chen | 361/718 |
| 5,299,632 | 4/1994 | Lee | 165/80.3 |
| 5,358,032 | 10/1994 | Arai et al. | 165/80.3 |

FOREIGN PATENT DOCUMENTS

| | | | |
|---|---|---|---|
| 1284506 | 12/1968 | Germany | 165/104.33 |
| 0065891 | 5/1980 | Japan | 165/104.33 |
| 0144396 | 11/1981 | Japan | 165/104.33 |
| 0646183 | 2/1979 | U.S.S.R. | 165/46 |

OTHER PUBLICATIONS

IBM Tech. Disclosure Bulletin vol. 14 No. 5 "Metal Cooling Fins For A Semiconductor Package" Horvath et al. Dec. 1983.

IBM T.D.B vol. 14 No. 5 "Transistor Heat Sink" J B Randolph Oct. 1971.

*Primary Examiner*—Allen J. Flanigan
*Attorney, Agent, or Firm*—Baker & Botts, L.L.P.

[57] ABSTRACT

A heat dissipation device for an integrated circuit includes a heat-conducting base plate having a bottom surface which is adapted to contact the upper surface of the integrated circuit, and a corrugated porous heat dissipating plate made of a flexible heat conducting material and fixed on the upper surface of the base plate so as to transfer heat from the base plate to the heat dissipating plate for heat dissipation. The heat dissipating plate has a plurality of ventilation holes formed therethrough, which are located over the base plate so as to enhance currents of air in the spaces between the base plate and the heat dissipating plate. Accordingly, the heat dissipating area in a unit of the space occupied by the heat dissipating plate is large enough to offer a quick and effective heat dissipation. Preferably, the base plate is made of an insulating material so as to prevent electric conduction from the integrated circuit to the base plate in case that the insulating coating of the integrated circuit is broken.

4 Claims, 5 Drawing Sheets

HEAT DISSIPATION DEVICE FOR AN INTEGRATED CIRCUIT

BACKGROUND OF THE INVENTION

1. Field of the Invention

This invention relates to a heat dissipation device, more particularly to a heat dissipation device for an integrated circuit, especially for a central processing unit of a computer.

2. Description of the Related Art

Nowadays, in a computer, the possible highest temperature of a central processing unit is over 100° C. However, because the permissible operation temperature of the central processing unit is normally limited to be below 60° C., a heat dissipation device has been developed to dissipate heat from the central processing unit. For example, U.S. Pat. No. 5,299,632 disclosed a fin device or heat dissipating body which is shown in FIGS. 1 and 2. As illustrated, the fin device 11 has a bottom surface contacting the upper surface of a central processing unit 20 and supports a fan unit 12 thereon. As shown in FIG. 2, the fin device 11 has a horizontal base plate portion 13 and a plurality of vertical fins 14 fixed on the upper surface of the base plate portion 13. Although the fin device 11 can dissipate effectively heat from the central processing unit 20, the base plate portion 13 and the fins 14 are too thick to effect quick dissipation. Furthermore, because the base plate portion 13 and the fins 14 are too thick, the heat dissipating area in a unit of the space occupied by the fin device 11 is reduced. As a result, the heat dissipating efficiency of the fin device 11 is reduced.

SUMMARY OF THE INVENTION

The main object of this invention is to provide a heat dissipation device for an integrated circuit which has an increased heat dissipation efficiency.

According to this invention, a heat dissipation device for an integrated circuit includes a heat-conducting base plate having a bottom surface which is adapted to contact the upper surface of the integrated circuit, and a corrugated porous heat dissipating plate made of a flexible heat conducting material and fixed on the upper surface of the base plate so as to transfer heat from the base plate to the heat dissipating plate for heat dissipation. The heat dissipating plate has a plurality of ventilation holes formed therethrough which are located over the base plate so as to enhance current of air in the spaces between the base plate and the heat dissipating plate. Accordingly, the heat dissipating area in a unit of the space occupied by the heat dissipating plate is large enough to offer a quick and effective heat dissipation. Preferably, the base plate is made of an insulating material so as to prevent electric conduction from the integrated circuit to the base plate in case that the insulating coating of the integrated circuit is broken. If necessary, a fan unit can be attached to the base plate so as to blow air to the heat dissipating plate and into the spaces between the base plate and the heat dissipating plate, thus forming air current immediately over and under the heat dissipating plate. In an embodiment, the heat dissipating plate has a portion which is located outside of the base plate so as to increase the heat dissipating area of the heat dissipating plate.

BRIEF DESCRIPTION OF THE DRAWINGS

Other features and advantages of this invention will become apparent in the following detailed description of the preferred embodiment of this invention with reference to the accompanying drawings, in which.

DETAILED DESCRIPTION OF THE PREFERRED EMBODIMENTS

Figure 3:
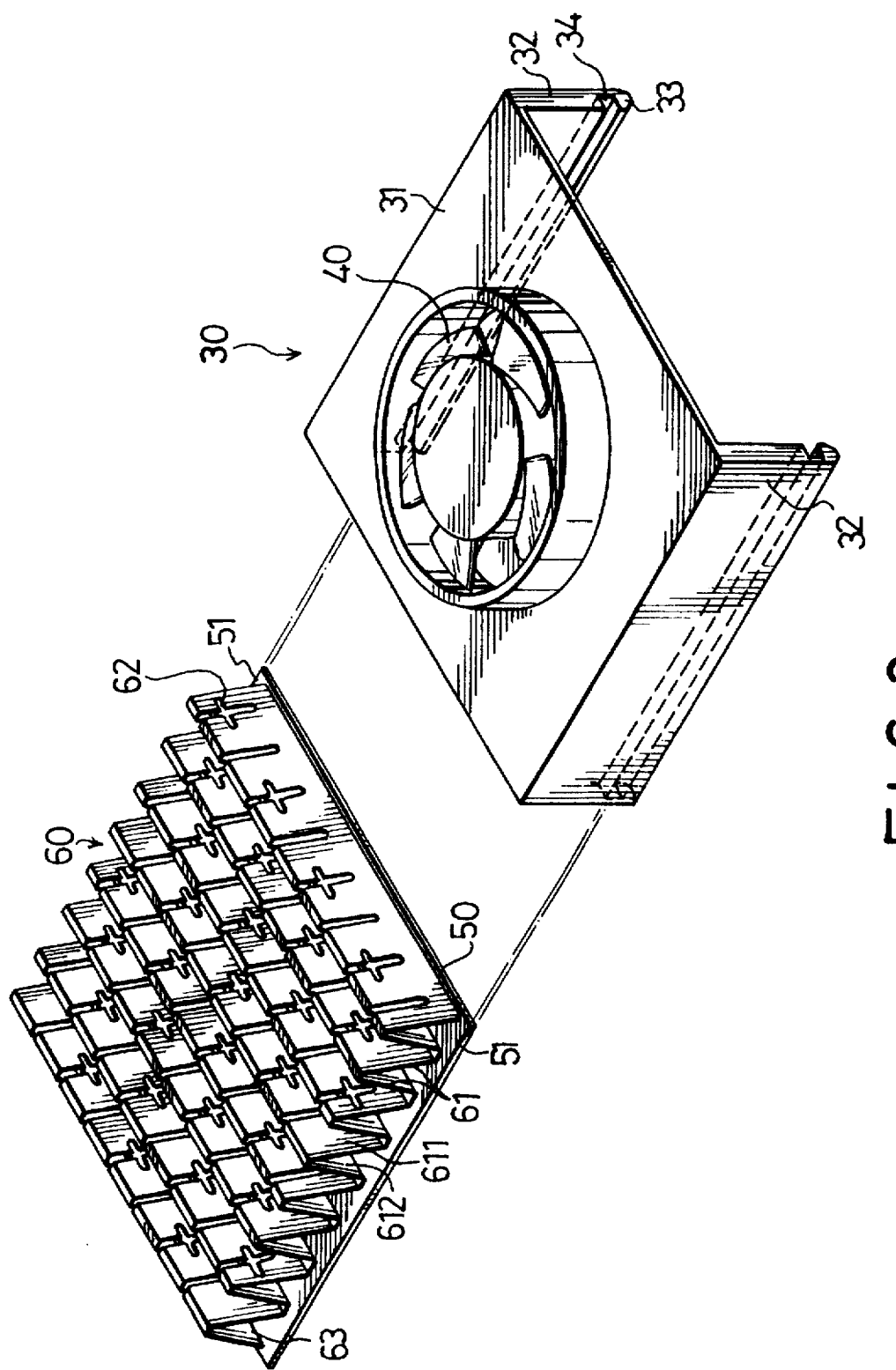
FIG. 3 is an exploded perspective view of a heat dissipation device for an integrated circuit according to a first embodiment of this invention.
Figure 4:
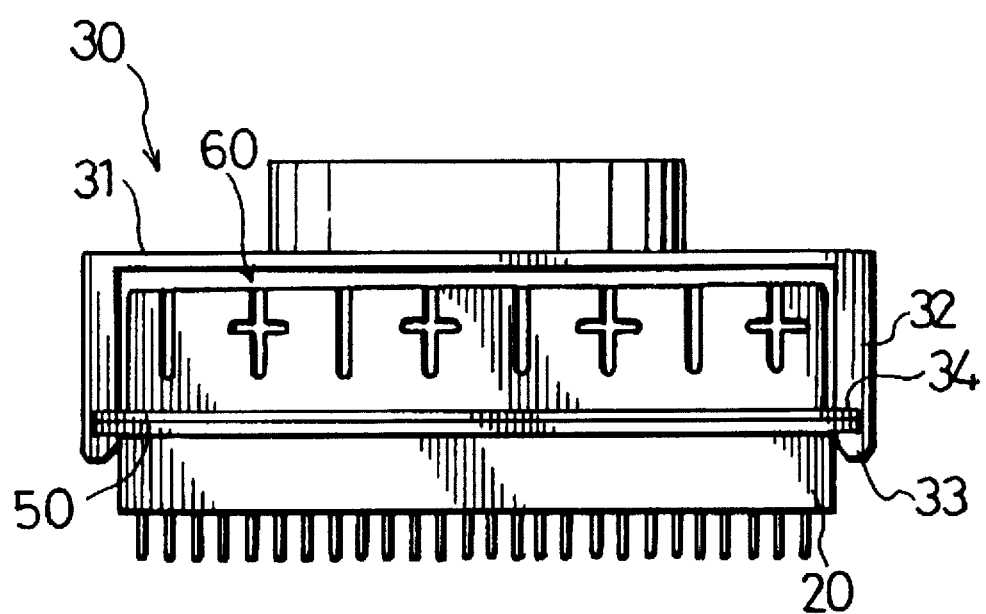
FIG. 4 is an assembled perspective view of the heat dissipation device for an integrated circuit according to the first embodiment of this invention, which is mounted on a central processing unit of a computer.

Referring to FIGS. 3 and 4, a heat dissipation device of this invention includes a retaining device or U-shaped retaining plate 30, a fan unit 40 supported on the retaining plate 30, a heat-conducting horizontal base plate 50 adapted to contact the upper surface of a central processing unit 20, and a corrugated porous heat dissipating plate 60 made of a flexible heat conducting material and fixed on the base plate 50.

The U-shaped retaining plate 30 consists of a horizontal top wall 31 and two vertical side walls 32. Each of the side walls 31 has an inner surface formed in the lower end portion 33 with an open-ended horizontal slot 34. The open-ended horizontal slots 34 of the U-shaped retaining plate 30 are respectively engaged with two opposite side portions 51 of the base plate 50 so as to retain the fan unit 40 on the base plate 50 over the corrugated heat dissipating plate 60.

The corrugated heat dissipating plate 60 consists of several generally V-shaped sections 61 each of which has an outward surface 611 and an inward surface 612, and each of which defines an elongated ventilation space 63 over the base plate 50 and under the heat dissipating plate 60. A plurality of ventilation holes 62 are formed through the heat dissipating plate 60 so as to permit the fan unit 40 to blow air into the ventilation spaces 63 which are located between the plates 50 and 60 via the holes 62, and so as to permit the hot air to flow from the ventilation spaces 63 via the holes 62.

Preferably, the base plate 50 is made of an insulating material so as to prevent electric conduction from the integrated circuit 20 to the base plate 50 in case that the insulating coating of the integrated circuit 20 is broken.

Figure 1:
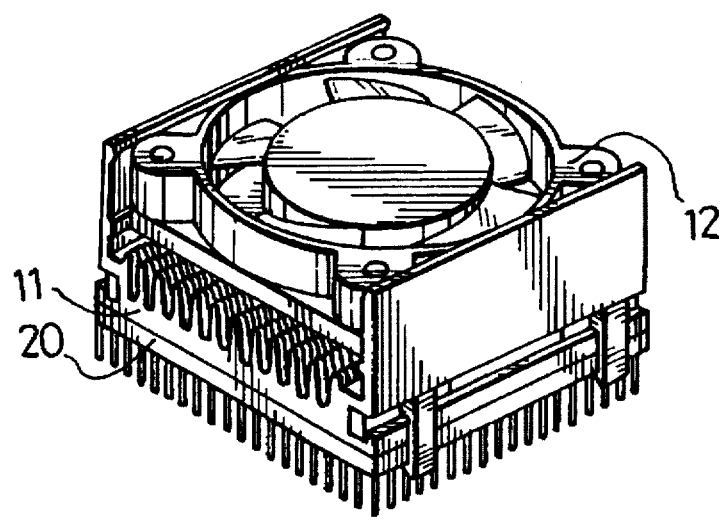
FIG. 1 is a perspective view showing an assembly of a conventional heat dissipation device and an integrated circuit.
Figure 2:
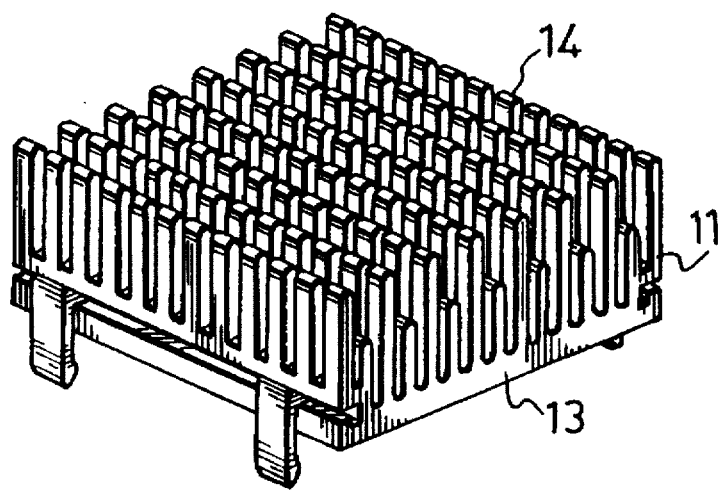
FIG. 2 is a perspective view showing the heat dissipating body of the conventional heat dissipation device.
Figure 5:
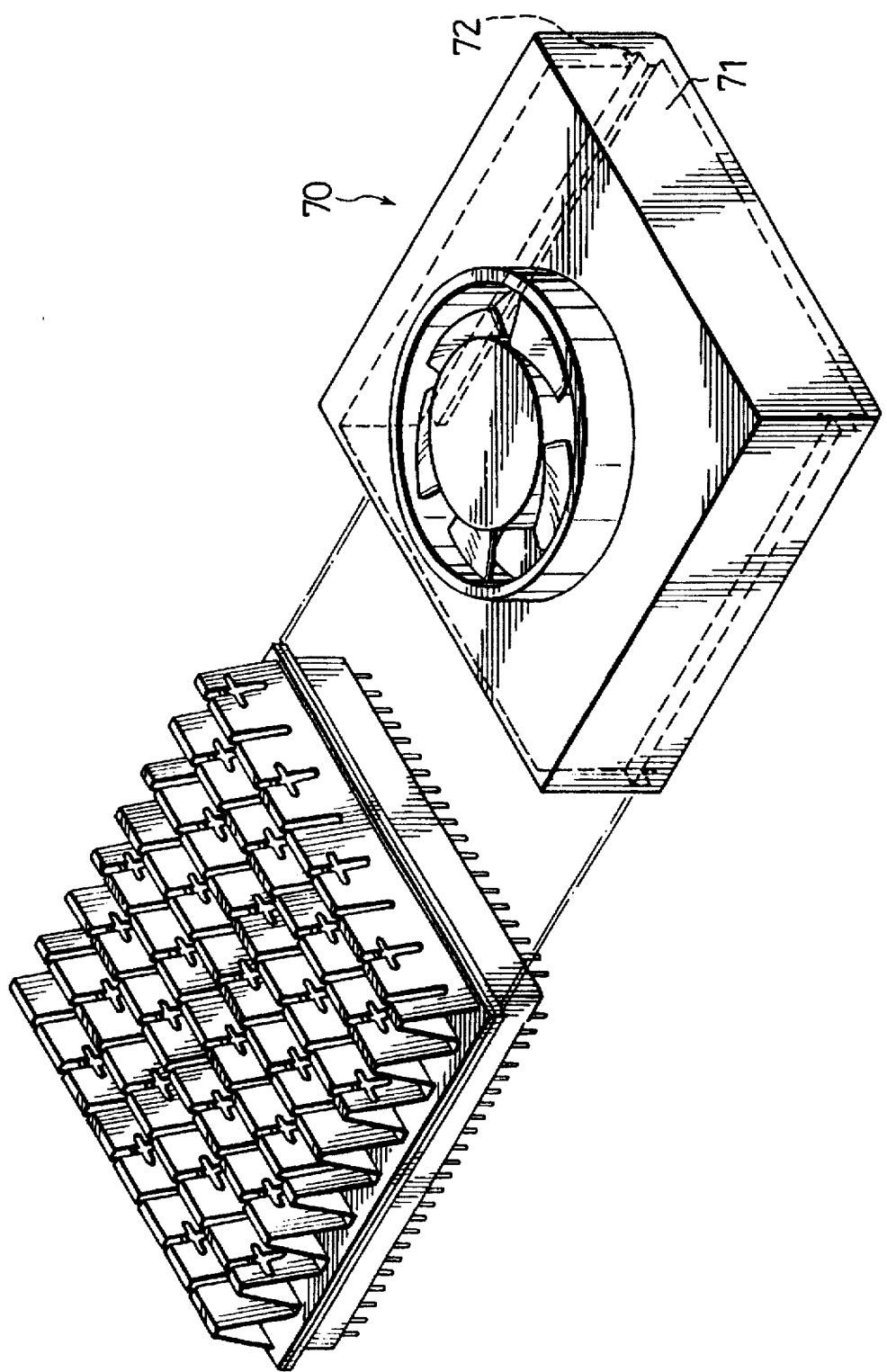
FIG. 5 is an exploded perspective view of a heat dissipation device for an integrated circuit according to a second embodiment of this invention.

Because the plates 50 and 60 are much thinner than the base plate portion 13 and the fins 14 of the conventional device shown in FIG. 2, the heat dissipation device of this invention can dissipate effectively and quickly from the central processing unit 20. The U-shaped retaining plate 30 may be modified into the retaining unit 70 of FIG. 5, which further has a third side wall 71 so as to close the right ends of the horizontal slots 72.

Figure 6:
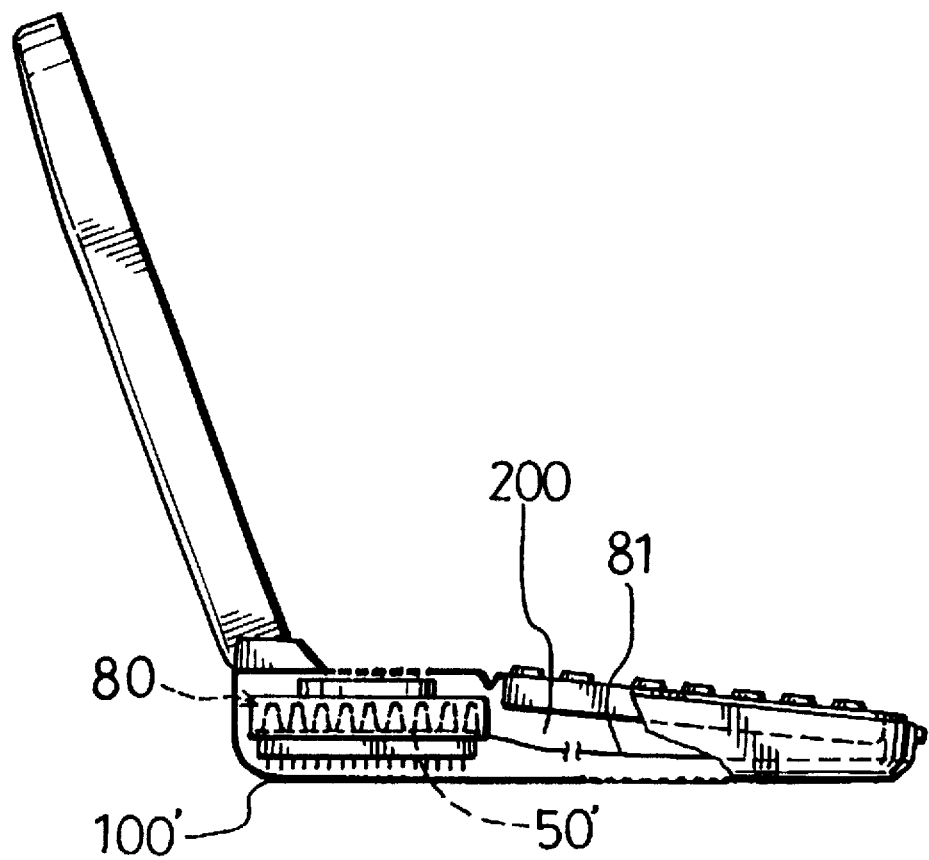
FIG. 6 is a schematic view of a heat dissipation device for an integrated circuit according to a third embodiment of this invention.

FIG. 6 illustrates the use of another embodiment of this invention in a note-book computer 100'. In this embodiment, the heat dissipating plate 80 has a portion 81 which is located outside of the base plate 50' and which extends into a larger ventilation space 200 in the housing of the computer 100', so as to increase the heat dissipating area of the heat dissipating plate 80. If necessary, the portion 81 of the heat dissipating plate 80 can extend out of the housing of the computer 100'. It is understood that the device of this invention can be applied to other technique fields, such as microprocessors and calculators.

With this invention thus explained, it is apparent that numerous modifications and variations can be made without departing from the scope and spirit of this invention. It is therefore intended that this invention be limited only as indicated in the appended claims.

I claim:

1. A heat dissipation device for an integrated circuit, comprising:
   - a heat-conducting base plate having a bottom surface which is adapted to contact an upper surface of the integrated circuit, and a corrugated perforated heat dissipating plate made of a flexible heat conducting material and fixed on an upper surface of said base plate so as to transfer heat from said base plate to said perforated heat dissipating plate for heat dissipation;
   - said perforated heat dissipating plate having a plurality of ventilation holes formed therethrough, which are located over said base plate so as to enhance air flow in a space between said base plate and said perforated heat dissipating plate; and
   - said perforated heat dissipating plate further having imperforate parts intervening with said ventilating holes, said imperforate parts being greater in area than said ventilating holes.

2. A heat dissipation device for an integrated circuit, comprising a heat-conducting base plate having a bottom surface which is adapted to contact an upper surface of the integrated circuit, and a corrugated heat dissipating plate made of a sheet of imperforate heat conducting material and fixed on an upper surface of said base plate, said corrugated heat dissipating plate having a plurality of first bent portions in contact with said base plate, a plurality of second bent portions extending away from said base plate, regions between said first bent portions and second bent portions, and a plurality of ventilation holes formed in said corrugated heat dissipating plate within said second bent portions and said regions, said first bent portions being free of said ventilation holes.

3. A heat dissipation device as claimed in claim 2, wherein said base plate is made of an insulating material so as to prevent electric conduction from the integrated circuit to said base plate.

4. A heat dissipation device as claimed in claim 2, further comprising a fan unit which is attached to said base plate and which blows air to said perforated heat dissipating plate and into the space between said base plate and said perforated heat dissipating plate so as to form air current immediately over and under said perforated heat dissipating plate.

* * * * *